(12) United States Patent
Hsin et al.

(10) Patent No.: US 7,638,830 B2
(45) Date of Patent: Dec. 29, 2009

(54) VERTICAL METAL-INSULATOR-METAL (MIM) CAPACITORS

(75) Inventors: Ping-Yi Hsin, Hsin-Chu (TW); Zan-Chun Wei, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 196 days.

(21) Appl. No.: 11/505,012

(22) Filed: Aug. 16, 2006

(65) Prior Publication Data
US 2006/0273427 A1    Dec. 7, 2006

Related U.S. Application Data

(62) Division of application No. 10/694,684, filed on Oct. 28, 2003, now Pat. No. 7,112,504.

(51) Int. Cl.
*H01L 31/112* (2006.01)
(52) U.S. Cl. ............... 257/307; 257/306; 257/310; 257/532
(58) Field of Classification Search ............. 257/301, 257/302, 303, 306, 307, 310, 532
See application file for complete search history.

(56) References Cited

U.S. PATENT DOCUMENTS

| 6,329,234 | B1 | 12/2001 | Ma et al. |
| 6,346,454 | B1 | 2/2002 | Sung et al. |
| 6,384,442 | B1 | 5/2002 | Chen |
| 6,495,874 | B1 | 12/2002 | Kawamura et al. |
| 6,528,384 | B2 | 3/2003 | Beckmann et al. |
| 6,589,862 | B2 | 7/2003 | Wang et al. |
| 6,593,185 | B1 | 7/2003 | Tsai et al. |
| 6,723,600 | B2 | 4/2004 | Wong et al. |
| 6,767,788 | B2 | 7/2004 | Kim |
| 2003/0027385 | A1 | 2/2003 | Park et al. |
| 2004/0137691 | A1* | 7/2004 | Choi ............... 438/381 |
| 2004/0224474 | A1 | 11/2004 | Barth et al. |

* cited by examiner

*Primary Examiner*—Fernando L Toledo
(74) *Attorney, Agent, or Firm*—Duane Morris LLP

(57) ABSTRACT

An MIM capacitor structure having a metal structure formed thereover is provided. A dielectric layer is disposed over the metal structure and a top layer is disposed over the dielectric layer. A capacitance trench is formed through the top layer and into the dielectric layer. Respective bottom electrodes are formed over the opposing side walls of the capacitance trench. A capacitance dielectric layer is disposed over the respective bottom electrodes, the bottom of the capacitance trench and the remaining top layer. Respective opposing initial via openings are formed adjacent the capacitance trench. Respective trench openings are formed above, continuous and contiguous with the lower portions of the respective opposing initial via openings and exposing portions of the underlying metal structure to form respective opposing dual damascene openings. Planarized metal portions disposed within the dual damascene openings and the capacitance trench form a top electrode.

20 Claims, 6 Drawing Sheets

VERTICAL METAL-INSULATOR-METAL (MIM) CAPACITORS

RELATED APPLICATION

This application is a divisional application of U.S. patent application Ser. No. 10/694,684, filed on Oct. 28, 2003, now U.S. Pat. No. 7,112,504 the contents of which are hereby incorporated by reference as if set forth in their entirety.

FIELD OF THE INVENTION

The present invention relates generally to semiconductor fabrication and more specifically to the formation of metal-insulator-metal (MIM) capacitors.

BACKGROUND

With conventional metal-insulator-metal (MIM) processes, there are poor planarization issues at the copper (Cu) area and low-dielectric constant (low-k) damage issues. A low-k damage and loss issue also occurs during ash for the polymer removal and photoresist strip.

U.S. Pat. No. 6,528,384 B2 to Beckmann et al. describes a method for manufacturing a trench capacitor. U.S. Pat. No. 6,495,874 B1 to Kawamura et al. describes a semiconductor device and production process thereof.

U.S. Pat. No. 6,384,442 B1 to Chen describes a fabrication process for metal-insulator-metal capacitor with low gate resistance. U.S. Pat. No. 6,346,454 B1 to Sung et al. describes a method of making dual damascene interconnect structure and metal electrode capacitor.

SUMMARY OF THE INVENTION

Accordingly, it is an object of one or more embodiments of the present invention to provide an improved method of forming MIM capacitors, and the MIM capacitors formed thereby. Other objects will appear hereinafter.

It has now been discovered that the above and other objects of the present invention may be accomplished in the following manner. Specifically, a structure having a metal structure formed thereover is provided. A dielectric layer is formed over the metal structure and a top layer is formed over the dielectric layer. A capacitance trench is formed through the top layer and into the dielectric layer. Respective bottom electrodes are formed over the opposing side walls of the capacitance trench. A capacitance dielectric layer is formed over: the respective bottom electrodes: the bottom of the capacitance trench; and the remaining top layer. Respective opposing initial via openings are formed adjacent the capacitance trench. Respective trench openings are formed above, continuous and contiguous with the lower portions of the respective opposing initial via openings and exposing portions of the underlying metal structure to form respective opposing dual damascene openings. Planarized metal portions are formed within: the dual damascene openings; and the capacitance trench to form a top electrode.

BRIEF DESCRIPTION OF THE DRAWING

The present invention will be more clearly understood from the following description taken in conjunction with the accompanying drawings in which like reference numerals designate similar or corresponding elements, regions and portions and in which.

DETAILED DESCRIPTION

The inventors have discovered that the reason for the poor planarization issues at the copper (Cu) area and low-dielectric constant (low-k) damage issues are because in the conventional MIM process, a high step height is formed which will make the lower via etching process window to both connect the top electrode and the metal layer.

In the present invention, the capacitance trench 25 and bottom electrodes 30', 30" therein are formed before the trench openings 56, 58 and final via openings 52, 54 are formed.

Figure 1:
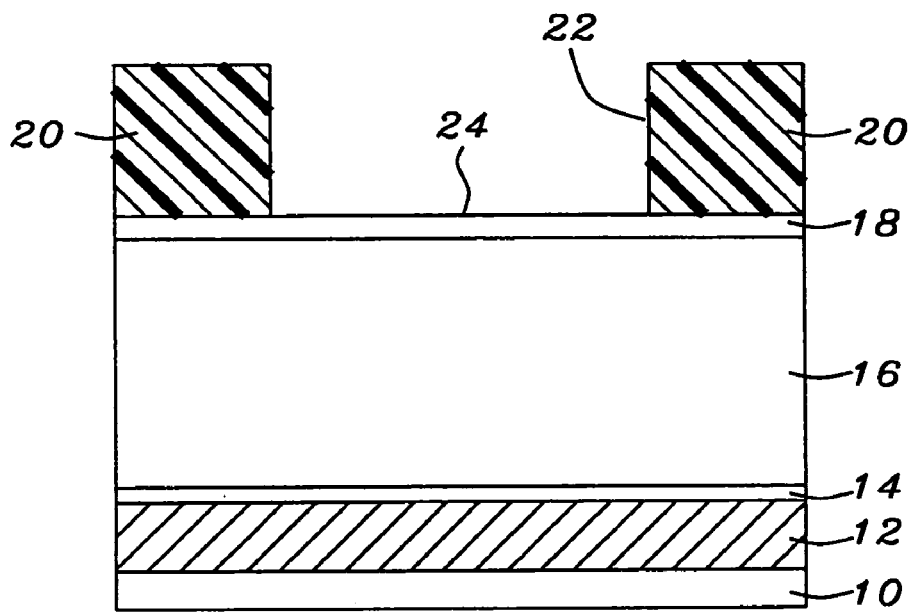
FIGS. 1 to 12 are each cross-sectional views that together schematically illustrate an embodiment of the present invention.

Initial Structure—FIG. 1

As shown in FIG. 1, structure 10 includes metal structure 12 formed thereover to a thickness of preferably from about 100 to 500 Å and more preferably from about 200 to 400 Å.

Structure 10 is preferably a silicon or germanium substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Metal structure 12 is preferably comprised of copper (Cu), aluminum (Al) or gold (Au) and is more preferably copper (Cu) as will be used for illustrative purposes hereafter. Metal structure 12 has a thickness of preferably from about 1000 to 9000 Å and more preferably from about 2000 to 8000 Å.

An etch stop layer 14 is formed over copper structure 12 to a thickness of preferably from about 300 to 900 Å and more preferably from about 400 to 600 Å. Etch stop layer 14 is preferably comprised of silicon nitride (SiN) or silicon carbide (SiC).

A dielectric layer 16 is formed over etch stop layer 14 to a thickness of preferably from about 2000 to 12,000 Å and more preferably from about 7000 to 9000 Å. Dielectric layer 16 is preferably a low-k material such as oxide, silicon oxide or FSG and is more preferably a low-k oxide material as will be used for illustrative purposes hereafter. For the purposes of this invention, low-k means a dielectric constant of less than about 3.0.

A top layer 18 is formed over oxide layer 16 to a thickness of preferably from about 300 to 1500 Å and more preferably from about 1000 to 14,000 Å. Top layer 18 is preferably an anti-reflective coating (ARC) 18 (as will be used for illustrative purposes hereafter) comprised of silicon oxynitride (SiON).

A first patterned masking layer 20 is formed over ARC 18 and includes opening 22 exposing a portion 24 of ARC 18. First patterned masking layer 20 is preferably comprised of photoresist as will be used for illustrative purposes hereafter.

Figure 2:
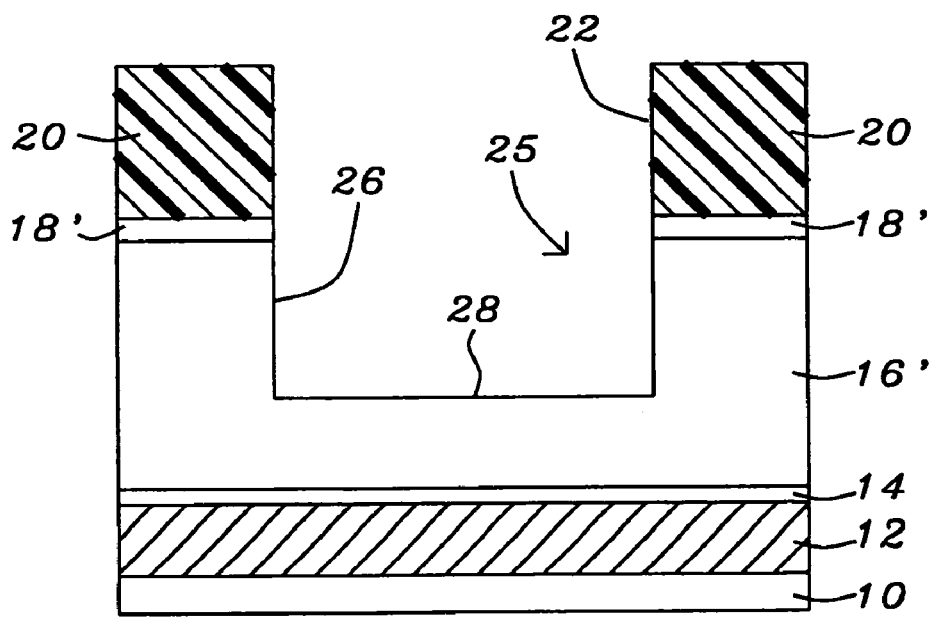

Formation of Capacitance Trench 25—FIG. 2

As shown in FIG. 2, using first patterned photoresist layer 20 as a mask, the exposed portion 24 of ARC 18 and a portion of the underlying oxide layer 16 are removed to define a capacitance trench 25 having side walls 26 and a bottom 28. The exposed portion 24 of ARC 18 and the portion of oxide layer 16 are removed preferably using an oxide etch process. It is noted that an etch stop layer (not shown) may be formed within oxide layer 16 to which the oxide etch process etches down to in defining the capacitance trench 25.

Capacitance trench 25 has a width of preferably from about 0.10 to 1.00 µm and more preferably from about 0.20 to 0.40 µm and has a depth of preferably from about 1000 to 9000 Å and more preferably from about 2000 to 6000 Å.

Figure 3:
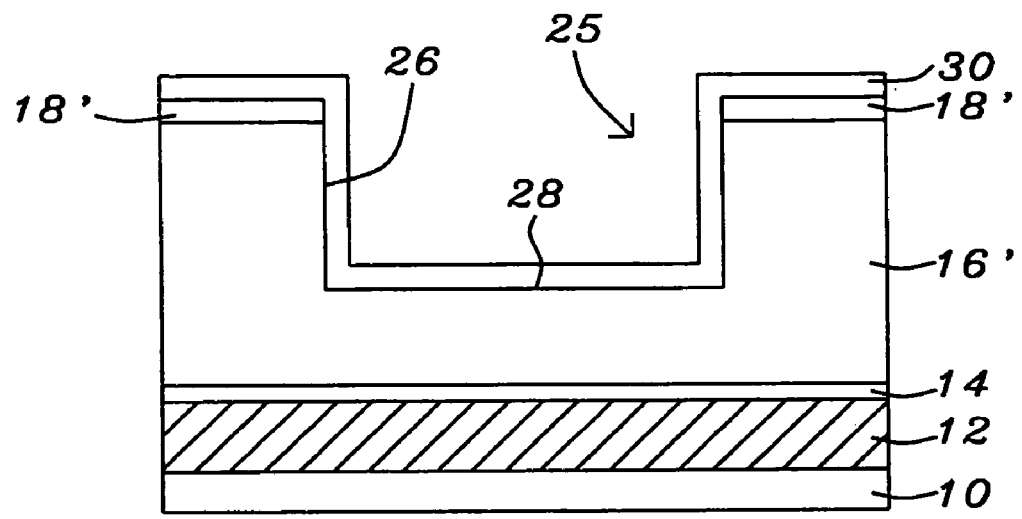

Formation of Bottom Electrode Layer 30—FIG. 3

As shown in FIG. 3, the first patterned masking layer 20 is removed from the structure of FIG. 2 and the structure is cleaned as necessary.

Then a bottom electrode layer 30 is formed over the patterned oxide layer 16' the capacitance trench side walls 26 and the capacitance trench bottom 28 to a thickness of preferably from about 100 to 500 Å and more preferably from about 200 to 400 Å. Bottom electrode layer 30 is preferably comprised of TaN or TiN and is more preferably TaN.

Figure 4:
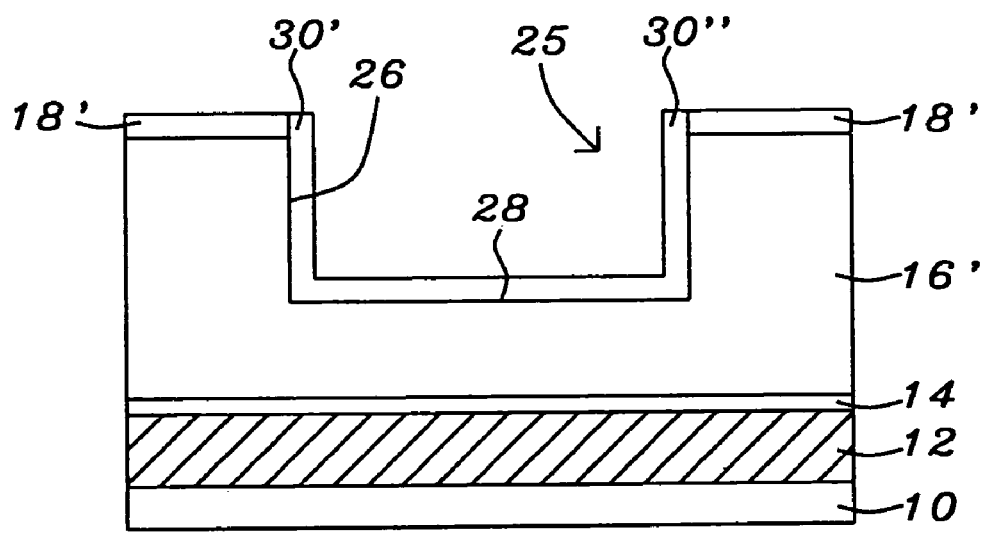

Anisotropic Etching of Bottom Electrode Layer 30 to Form Bottom Electrodes 30', 30"—FIG. 4

As shown in FIG. 4, an anisotropic etch is performed to remove the horizontal portions of the bottom electrode layer 30 and forming respective bottom electrodes 30', 30" over the opposing side walls 26 of the capacitance trench 25 leaving exposed a smaller portion of the bottom 28 of the capacitance trench.

Figure 5:
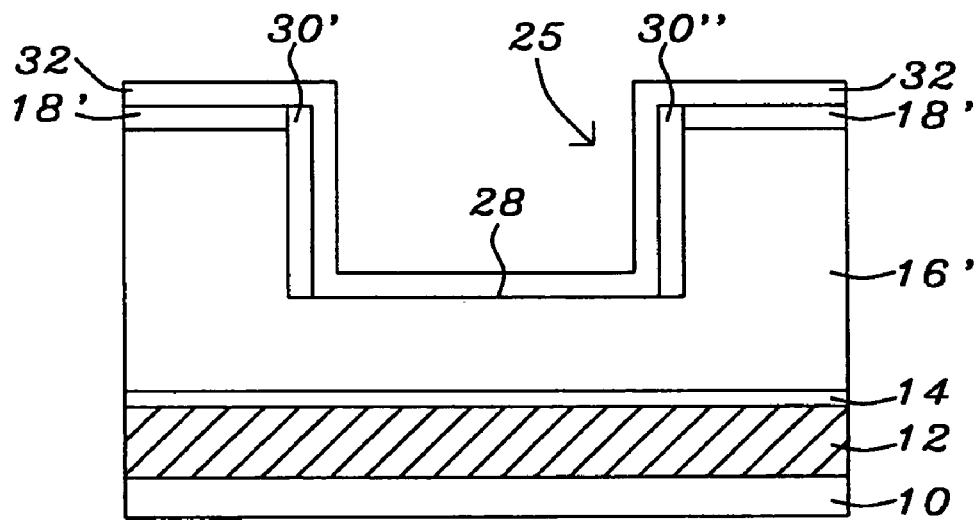

Formation of Capacitance Dielectric Layer 32—FIG. 5

As shown in FIG. 5, a capacitance dielectric layer 32 is formed over the patterned oxide layer 16, the bottom electrodes 30', 30" and the bottom 28 of the capacitance trench 25 to a thickness of preferably from about 100 to 600 Å and more preferably from about 250 to 350 Å. Capacitance dielectric layer 32 is preferably comprised of oxide or silicon oxide and is more preferably oxide.

Figure 6:
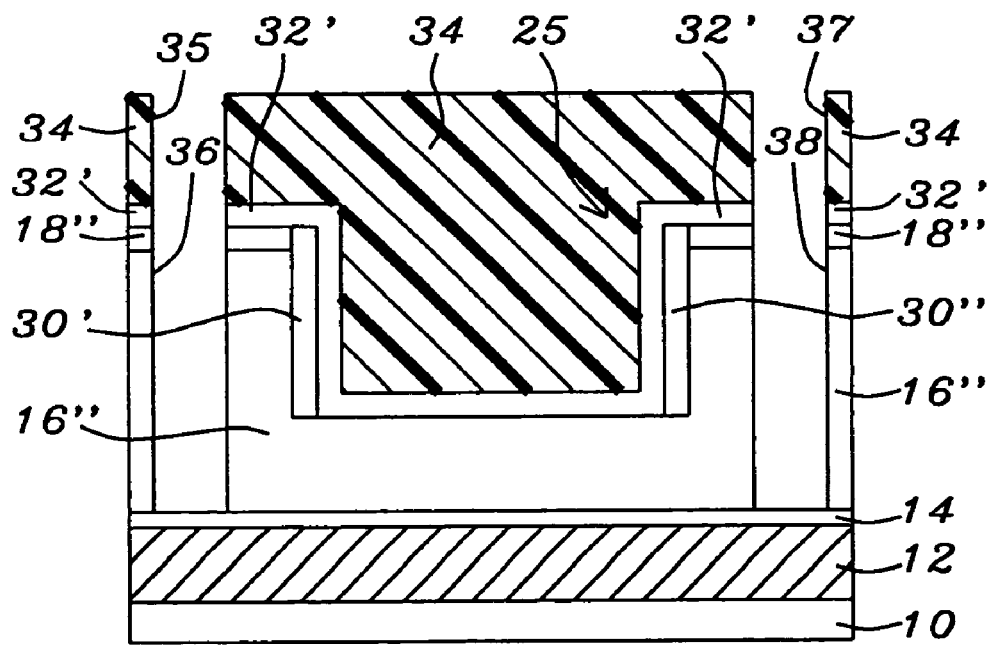

Formation of Initial Via Openings 36, 38—FIG. 6

As shown in FIG. 6, a second patterned masking layer 34 is formed over the structure of FIG. 5. Second patterned masking layer 34 includes openings 35, 37 exposing respective opposing portions of the capacitance dielectric layer 32 proximate the capacitance trench 25. Second patterned masking layer 34 is preferably comprised of photoresist as will be used for illustrative purposes hereafter.

Using second patterned photoresist layer 34 as a mask, the portions of the capacitance dielectric layer 32 exposed by the second patterned photoresist layer openings 35, 37, the underlying portions of the patterned ARC 18' and the underlying portions of the patterned oxide layer 16' down to the underlying etch stop layer 14 are removed to form respective initial via openings 36, 38. Initial via openings 36, 38 each have a width of preferably from about 0.10 to 0.50 µm and more preferably from about 0.15 to 1.46 µm.

Figure 7:
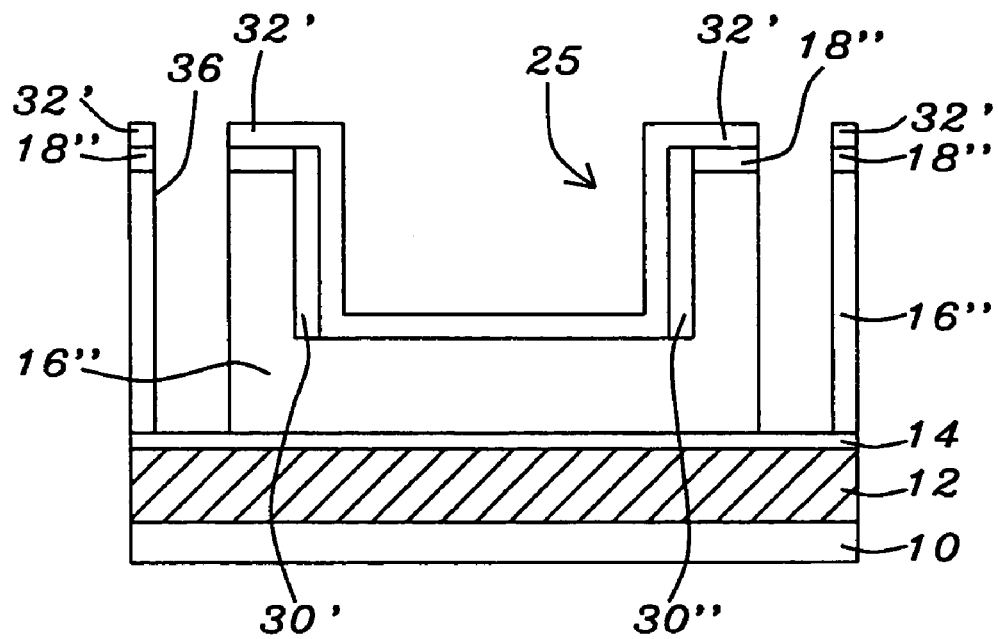

Removal of Second Patterned Photoresist Layer 34—FIG. 7

As shown in FIG. 7, second patterned photoresist layer 34 is removed and the structure is cleaned as necessary.

Figure 8:
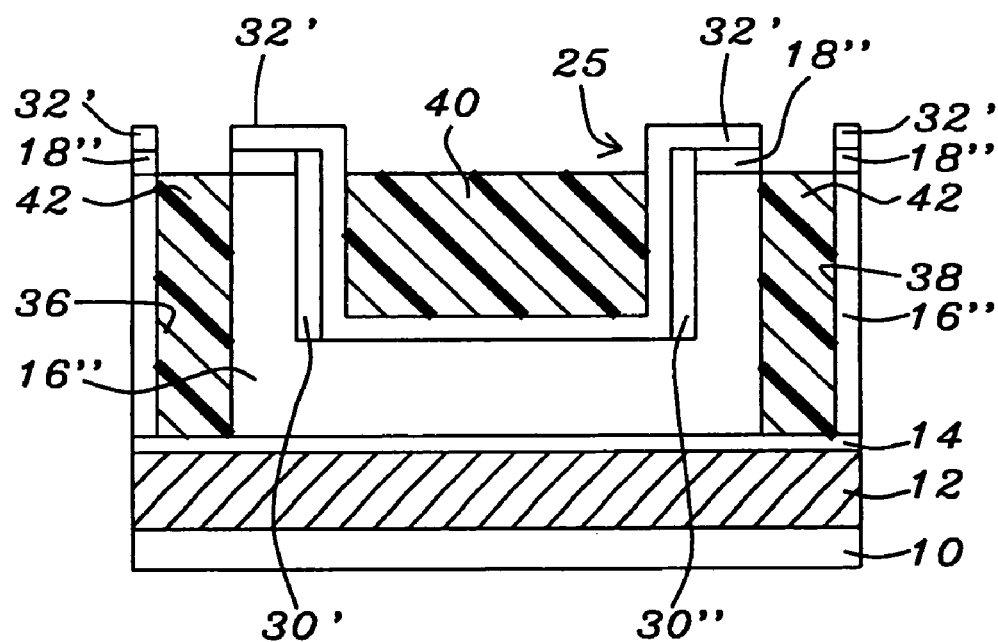

Formation of Etched-Back Third Masking Layer Portions 40, 42—FIG. 8

As shown in FIG. 8, a third masking layer is formed over the structure of FIG. 7, filling the initial via openings 36, 38 and the capacitance dielectric layer lined capacitance trench 25, and the third masking layer is then etched back to leave portions 42 within respective initial via openings 36, 38 and portion 40 within the capacitance dielectric layer lined capacitance trench 25. Third patterned masking layer portions 40, 42 are preferably comprised of photoresist, as will be used for illustrative purposes hereafter.

Figure 9:
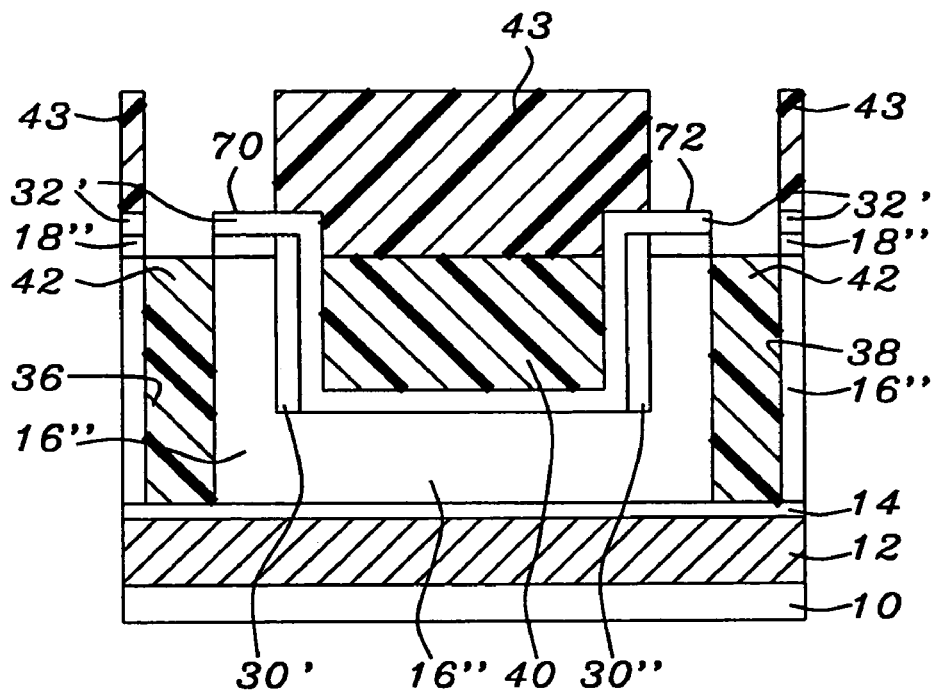

Formation of Capacitance Trench Masking Portion 43—FIG. 9

As shown in FIG. 9, a capacitance trench masking portion 43 is formed over the third patterned photoresist portion 40 within the capacitance dielectric layer lined capacitance trench 25, over portions of the patterned capacitance dielectric layer 32' adjacent the capacitance trench 25 above the respective bottom electrodes 30', 30" and over portions of the patterned capacitance dielectric layer 32' outboard of respective initial via openings 36, 38.

This leaves exposed portions 70, 72 of the patterned capacitance dielectric layer 32' between the respective initial via openings 36, 38 and the capacitance trench masking portion 43.

Capacitance trench masking portion 43 is preferably comprised of photoresist as will be used for illustrative purposes hereafter.

Figure 10:
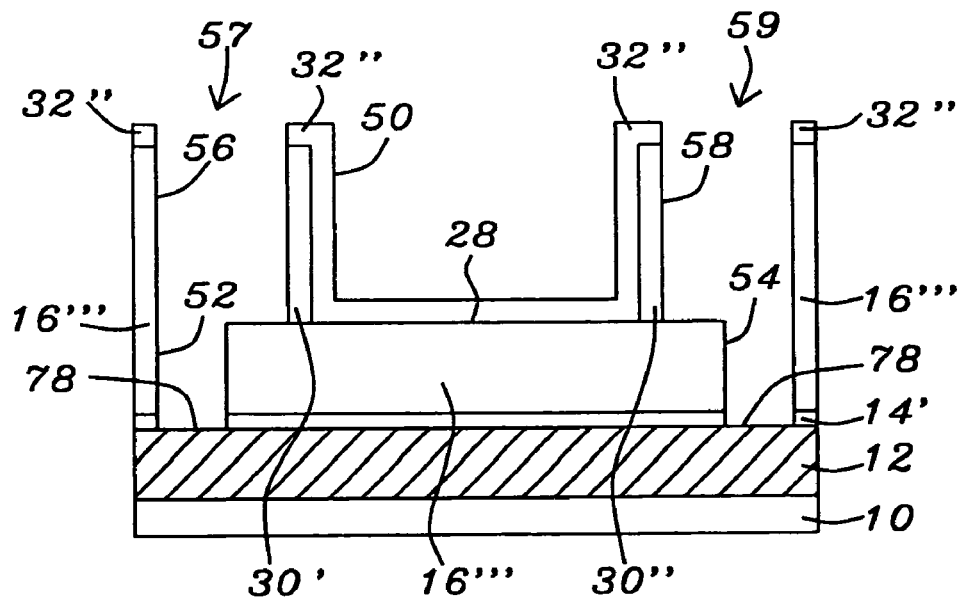

Formation of Trench Openings 56, 58—FIG. 10

As shown in FIG. 10, using photoresist capacitance trench masking portion 43 as a mask, the exposed portions 70, 72 of the patterned capacitance dielectric layer 32' between the respective initial via openings 36, 38 and the capacitance trench masking portion 43, the underlying twice patterned ARC 18" and the underlying twice patterned oxide layer 16" down to a depth substantially equal to the bottom of the capacitance trench 25 to form respective trench openings 56, 58 contiguous and continuous with respective final via openings 52, 54, in turn forming respective dual damascene openings 57, 59. Final via openings 52, 54 expose underlying portions 78 of metal structure 12.

Figure 11:
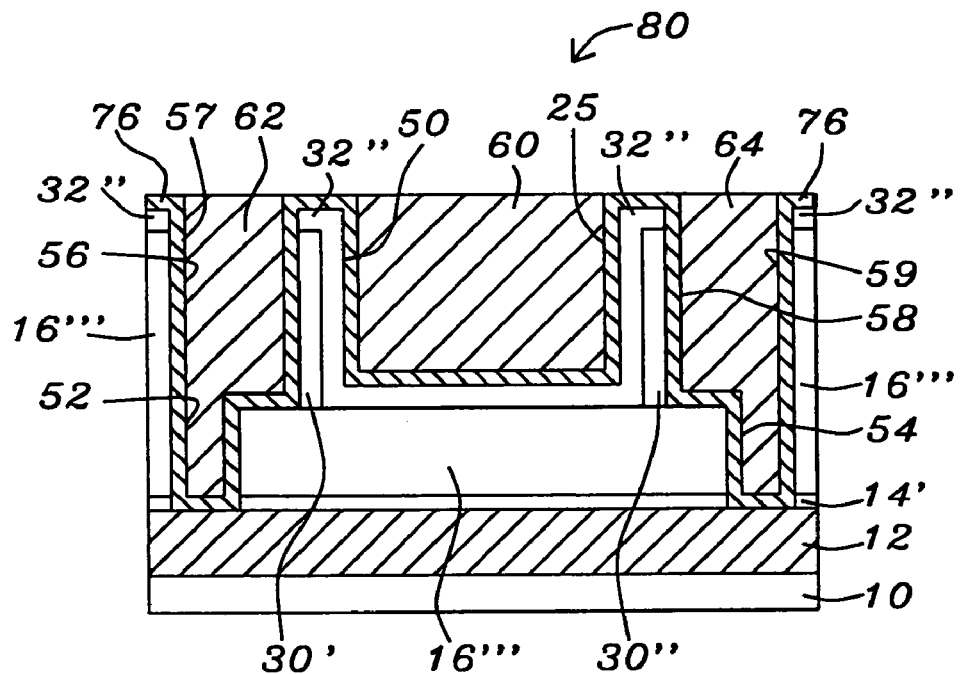

Formation of Barrier Layer 76 and Planarized Metal Portions 60, 62, 64—FIG. 11

As shown in FIG. 11, a barrier layer 76 is formed over the structure of FIG. 10, lining the respective dual damascene openings 57, 59 and the capacitance dielectric layer lined capacitance trench 25 to a thickness of preferably from about 100 to 400 Å and more preferably from about 250 to 350 Å. Barrier layer 76 is preferably comprised of TaN or TiN.

A metal layer is formed over the structure, at least filling the barrier layer 76 lined respective dual damascene openings 57, 59 and capacitance trench 25 and is then planarized to remove the excess of the metal layer overlying the barrier layer 76 lined respective dual damascene openings 57, 59 and capacitance trench 25 to form: respective planarized metal portions 62, 64 within respective dual damascene openings 57, 59; and top electrode portion 60 within capacitance trench 25 to complete formation of MIM capacitor 80.

The planarized metal portions 62, 64 and the top electrode portion 60 are preferably comprised of copper, aluminum or gold and are more preferably copper.

Figure 12:
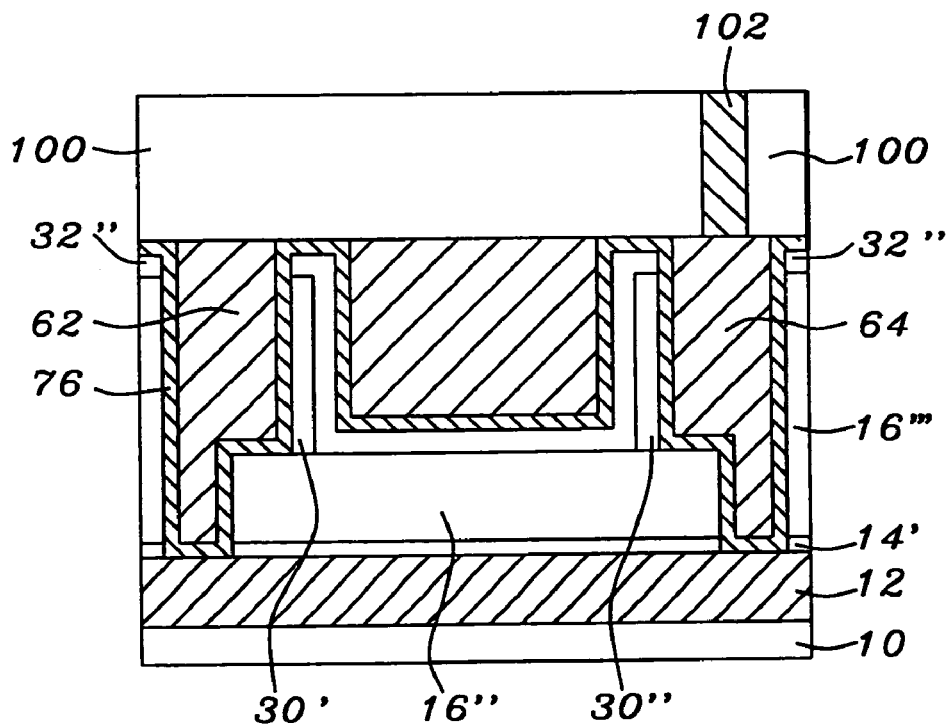

Further processing may then proceed. For example, as shown in FIG. 12, an inter-metal dielectric layer (IMD) 100 may be formed over the MIM capacitor 80 and a contact 102 may be formed through the IMD layer 100 to contact the MIM capacitor 80 at planarized metal portion 64.

It is noted that the method of the present invention changes the capacitor layout from horizontal to vertical at the copper (Cu) chemical mechanical process (CMP).

Advantages of the Present Invention

The advantages of one or more embodiments of the present invention include:

1. less planarization than previous processes for extra layer added, i.e. need extra mask photo like alignment mark open;

2. less low-k damage for low-k oxide layer 16 thickness loss during ashing and k-loss;

3. Less MIM capacity than in conventional designs for the MIM is changed from horizontal to vertical;

4. No extra MIM define step like current, i.e. conventional MIM needs to add another mask to define the top electrode;

5. Reduced leakage problem due to etching polymer issue for polymer induce metal (top) and metal (bottom electrode); and 6. Lower cost by saving alignment mark (AM) etching and less masking.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A vertical MIM capacitor, comprising:
   a bottom structure having a metal structure formed thereover;
   a patterned dielectric layer over the metal structure;
   a metal-insulator-metal structure within the patterned dielectric layer and including metal portions along each of first and second opposing outer sides of an upright U shaped section of the patterned dielectric layer;
   a first planarized metal portion adjacent the first opposing outer side; the first planarized metal portion being in electrical connection with the metal structure;
   a second planarized metal portion adjacent the second outer opposing side;
   an inter-metal dielectric layer over the metal-insulator-metal structure and the first and second planarized metal portions; and
   a contact within the inter-metal dielectric layer in electrical contact with the second planarized metal portion.

2. The structure of claim 1, wherein the bottom structure is a silicon substrate, a germanium substrate, a semiconductor wafer or a semiconductor substrate.

3. The structure of claim 1, wherein the metal structure is comprised of copper, aluminum or gold; the patterned dielectric layer is comprised of an oxide material having a dielectric constant of less than about 3.0, silicon oxide or FSG; and the planarized metal portions are comprised of copper, aluminum or gold.

4. The structure of claim 1, wherein the metal structure is comprised of copper; the dielectric layer is comprised of an oxide material having a dielectric constant of less than about 3.0; and the planarized metal portions are comprised of copper.

5. The structure of claim 1, wherein the metal structure has a thickness of from about 1000 to 9000 Å; and the patterned dielectric layer has a thickness of from about 2000 to 12,000 Å.

6. The structure of claim 1, wherein the metal structure has a thickness of from about 2000 to 8000 Å; and the dielectric layer has a thickness of from about 7000 to 9000 Å.

7. The structure of claim 1, further comprising a pair of respective bottom electrodes interposed between the upright U shaped section and the first and second planarized metal portions.

8. The structure of claim 1, including a pair of respective bottom electrodes interposed between the upright U shaped section and the first and second planarized metal portions; the pair of respective bottom electrodes each being comprised of TaN or TiN and having a thickness of from about 100 to 500 Å.

9. The structure of claim 1, including a pair of respective bottom electrodes interposed between the upright U shaped section and the first and second planarized metal portions; the pair of respective bottom electrodes each being comprised of TaN and TiN and having a thickness of from about 200 to 400 Å.

10. A vertical MIM capacitor, comprising:
    a bottom structure having a metal structure formed thereover;
    a patterned dielectric layer over the metal structure;
    a metal-insulator-metal structure within the patterned dielectric layer; the metal-insulator-metal structure having a first and second opposing sides;
    a first planarized metal portion bordering the metal-insulator-metal structure on the first opposing side; the first planarized metal portion being in electrical connection with the metal structure;
    a second planarized metal portion bordering the metal-insulator-metal structure on the second opposing side;
    an inter-metal dielectric layer over the metal-insulator-metal structure and the first and second planarized metal portion;
    a contact within the inter-metal dielectric layer in electrical contact with the second planarized metal portion; and
    a pair of respective bottom electrodes interposed between the metal-insulator-metal structure and the first and second planarized metal portions.

11. The structure of claim 10, wherein the metal structure is comprised of copper, aluminum or gold; the patterned dielectric layer is comprised of an oxide material having a dielectric constant of less than about 3.0, silicon oxide or FSG; and the planarized metal portions are comprised of copper, aluminum or gold.

12. The structure of claim 10, wherein the bottom structure is a silicon substrate, a germanium substrate, a semiconductor wafer or a semiconductor substrate.

13. A vertical MIM capacitor, comprising:
    a bottom structure having a metal structure formed thereover;

a patterned dielectric layer over the metal structure;

a metal-insulator-metal structure within the patterned dielectric layer, the metal-insulator-metal structure having first and second opposing sides;

a first planarized metal portion adjacent bordering the metal-insulator-metal structure on the first opposing side; the first planarized metal portion being in electrical connection with the metal structure;

a second planarized metal portion bordering the metal-insulator-metal structure on the second opposing side;

an inter-metal dielectric layer over the metal-insulator-metal structure and the first and second planarized metal portion;

a contact within the inter-metal dielectric layer in electrical contact with the second planarized metal portion; and a pair of respective bottom electrodes interposed between the metal-insulator-metal structure and the first and second planarized metal portions; the pair of respective bottom electrodes each being comprised of TaN or TiN and having a thickness of from about 100 to 500 Å.

14. The structure of claim 13, wherein the metal-insulator-metal structure includes the first and second opposing sides being first and second opposing outer sides of an upright U shaped section of the patterned dielectric layer, the first planarized metal portion is bordering the first opposing outer side; and the second planarized metal portion is bordering the second opposing outer side.

15. The structure of claim 13, wherein the bottom structure is a silicon substrate, a germanium substrate, a semiconductor wafer or a semiconductor substrate.

16. The structure of claim 13, wherein the metal structure is comprised of copper, aluminum or gold; the patterned dielectric layer is comprised of an oxide material having a dielectric constant of less than about 3.0, silicon oxide or FSG; and the planarized metal portions are comprised of copper, aluminum or gold.

17. The structure of claim 13, wherein the metal structure is comprised of copper; the dielectric layer is comprised of an oxide material having a dielectric constant of less than about 3.0; and the planarized metal portions are comprised of copper.

18. The structure of claim 13, wherein the metal structure has a thickness of from about 1000 to 9000 Å; and the patterned dielectric layer has a thickness of from about 2000 to 12,000 Å.

19. The structure of claim 13, wherein the metal structure has a thickness of from about 2000 to 8000 Å; and the dielectric layer has a thickness of from about 7000 to 9000 Å.

20. The structure of claim 13, further comprising a pair of respective bottom electrodes interposed between the metal-insulator-metal structure and the first and second planarized metal portions.

* * * * *

UNITED STATES PATENT AND TRADEMARK OFFICE
CERTIFICATE OF CORRECTION

PATENT NO. : 7,638,830 B2
APPLICATION NO. : 11/505012
DATED : December 29, 2009
INVENTOR(S) : Ping-Yi Hsin et al.

It is certified that error appears in the above-identified patent and that said Letters Patent is hereby corrected as shown below:

Front page, replace "Zan-Chun Wei" with --Zin Chein Wei--
Column 7, line 5, claim 13, replace "adjacent bordering" with --bordering--

Signed and Sealed this

Twenty-fourth Day of August, 2010

David J. Kappos
*Director of the United States Patent and Trademark Office*